United States Patent
Park et al.

(10) Patent No.: US 10,686,149 B2
(45) Date of Patent: Jun. 16, 2020

(54) OPTOELECTRONIC DIODES AND ELECTRONIC DEVICES INCLUDING SAME

(71) Applicant: Samsung Electronics Co., Ltd., Suwon-si, Gyeonggi-do (KR)

(72) Inventors: Kyung Bae Park, Hwaseong-si (KR); Gae Hwang Lee, Seongnam-si (KR); Takkyun Ro, Hwaseong-si (KR); Yong Wan Jin, Seoul (KR); Chul Joon Heo, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/166,873

(22) Filed: Oct. 22, 2018

(65) Prior Publication Data
US 2019/0058143 A1 Feb. 21, 2019

Related U.S. Application Data

(63) Continuation of application No. 15/478,687, filed on Apr. 4, 2017, now Pat. No. 10,115,919.

(30) Foreign Application Priority Data

Nov. 28, 2016 (KR) .................. 10-2016-0159337

(51) Int. Cl.
*H01L 51/44* (2006.01)
*H01L 27/30* (2006.01)
(Continued)

(52) U.S. Cl.
CPC .......... *H01L 51/442* (2013.01); *H01L 27/302* (2013.01); *H01L 27/307* (2013.01);
(Continued)

(58) Field of Classification Search
CPC ... H01L 51/442; H01L 51/52; H01L 51/5203; H01L 2251/55; H01L 51/0046;
(Continued)

(56) References Cited

U.S. PATENT DOCUMENTS

| 6,998,789 B2 | 2/2006 | Uchida |
| 2010/0037947 A1 | 2/2010 | Lee et al. |

(Continued)

FOREIGN PATENT DOCUMENTS

| JP | 20054062 A | 1/2005 |
| KR | 2010-0021045 A | 2/2010 |

(Continued)

*Primary Examiner* — Jasmine J Clark
(74) *Attorney, Agent, or Firm* — Harness, Dickey & Pierce, P.L.C.

(57) ABSTRACT

An optoelectronic diode may include a first electrode, a second electrode, a third electrode, a first active layer between the first and second electrodes, and a second active layer between the second and third electrodes. Two of the electrodes may be electrically connected to each other and may have different resistances. The first and second active layers may be isolated from each other. The first active layer, the first electrode, and the second electrode may form a diode, and the second active layer, the second electrode, and the third electrode may form a diode. The second electrode may have a refractive index different from a refractive index of the second active layer.

24 Claims, 15 Drawing Sheets

(51) Int. Cl.
*H01L 27/32* (2006.01)
*H01L 51/52* (2006.01)
*H01L 51/42* (2006.01)
*H01L 51/00* (2006.01)

(52) U.S. Cl.
CPC ...... *H01L 27/3209* (2013.01); *H01L 51/4253* (2013.01); *H01L 51/52* (2013.01); *H01L 51/5203* (2013.01); *H01L 51/0046* (2013.01); *H01L 2251/55* (2013.01); *Y02E 10/549* (2013.01)

(58) Field of Classification Search
CPC . H01L 27/302; H01L 27/3206; H01L 27/307; H01L 27/3209; Y02E 10/549
See application file for complete search history.

(56) References Cited

U.S. PATENT DOCUMENTS

| | | | |
|---|---|---|---|
| 2015/0115226 A1* | 4/2015 | Scire | H01L 27/288 257/40 |
| 2015/0243920 A1 | 8/2015 | Edman et al. | |
| 2017/0229437 A1* | 8/2017 | Wehlus | H01L 27/3202 |
| 2017/0269146 A1* | 9/2017 | Regau | H05B 33/0827 |

FOREIGN PATENT DOCUMENTS

| | | |
|---|---|---|
| KR | 20110070558 A | 6/2011 |
| KR | 20110132161 A | 12/2011 |

\* cited by examiner

OPTOELECTRONIC DIODES AND ELECTRONIC DEVICES INCLUDING SAME

CROSS-REFERENCE TO RELATED APPLICATIONS

This application is a continuation of U.S. application Ser. No. 15/478,687, filed on Apr. 4, 2017, now U.S. Pat. No. 10,115,919, which claims priority to and the benefit of, under 35 U.S.C. § 119, Korean Patent Application No. 10-2016-0159337 filed in the Korean Intellectual Property Office on Nov. 28, 2016, the entire contents of which are incorporated herein by reference.

BACKGROUND

1. Field

Example embodiments described herein are directed to optoelectronic diodes and electronic devices including same.

2. Description of the Related Art

An optoelectronic diode is a device that may convert electrical energy into photoenergy, and vice versa.

An optoelectronic diode may be configured to enable excitons to be generated by photoenergy, separated into electrons and holes, and transferred to different electrodes to generate electrical energy. An optoelectronic diode may include a light emitting device where a voltage or a current is supplied to an electrode to generate photoenergy from electrical energy.

SUMMARY

An embodiment provides an optoelectronic diode having a novel structure.

Some example embodiments provide an electronic device including the optoelectronic diode.

According to some example embodiments, an optoelectronic diode may include a first electrode and a second electrode electrically connected to each other, a third electrode proximate to at least one of the first electrode and the second electrode, a first active layer between a first two electrodes of the first electrode, the second electrode, and the third electrode, and a second active layer between a second two electrodes of the first electrode, the second electrode, and the third electrode, the second active layer isolated from the first active layer.

The resistance of the second electrode may be greater than about 2,000Ω.

The resistance of the first electrode may be between about 10Ω to about 2,000Ω and the resistance of the second electrode may be greater than about 2,000Ω and less than or equal to about 30,000Ω.

The first electrode may include a conductive oxide, a metal thin film, graphene, or a carbon nanotube. The first electrode may have a resistance of about 10Ω to about 2,000Ω. The second electrode may include a conductive oxide, a metal thin film, graphene, or a carbon nanotube. The second electrode may have a resistance of greater than about 2,000Ω and less than or equal to about 30,000Ω.

The first active layer may be between the first electrode and the second electrode, the second active layer may be between the second electrode and the third electrode, and the second electrode may be a transparent electrode.

The first active layer may be between the first electrode and the third electrode, the second active layer may be between the second electrode and the third electrode, and the third electrode may be a transparent electrode.

The first active layer may be between the third electrode and the second electrode, the second active layer may be between the first electrode and the second electrode, and the second electrode may be a transparent electrode.

The first active layer may include pn junction, the pn junction including a first p-type semiconductor and a first n-type semiconductor.

At least one semiconductor of the first p-type semiconductor and the first n-type semiconductor may include a light-absorbing material configured to selectively absorb one of ultraviolet light, infrared light, visible light in a red wavelength spectrum of light, visible light in a green wavelength spectrum of light, and visible light in a blue wavelength spectrum of light.

A composition ratio ($p^1/n^1$) of the first p-type semiconductor relative to the first n-type semiconductor may be greater than or equal to about 1.0.

The second active layer may include at least one semiconductor of a second p-type semiconductor and a second n-type semiconductor, the second p-type semiconductor being common with or different from the first p-type semiconductor, the second n-type semiconductor being common with or different from the first n-type semiconductor.

The first active layer may be proximate to a light receiving side in relation to the second active layer.

The first electrode and the second electrode may be a common electrode and the third electrode may be a pixel electrode.

According to some example embodiments, an optoelectronic diode may include a sequential stack of a first electrode, a first active layer, a second electrode, a second active layer, and a third electrode, wherein the second electrode is electrically connected to the first electrode or the third electrode and a resistance of the second electrode is higher than a resistance of the electrode, of the first electrode and the third electrode, to which the second electrode is electrically connected.

The resistance of the second electrode may be greater than about 2,000Ω.

One electrode of the first electrode or the third electrode may include a conductive oxide, a metal thin film, graphene, or a carbon nanotube. The one electrode may have a resistance of about 10Ω to about 2,000Ω. The second electrode may include a conductive oxide, a metal thin film, graphene, or a carbon nanotube. The second electrode may have a resistance of greater than about 2,000Ω and less than or equal to about 30,000Ω.

The first active layer may include a pn junction, the pn junction including a first p-type semiconductor and a first n-type semiconductor.

At least one semiconductor of the first p-type semiconductor and the first n-type semiconductor may include a light-absorbing material configured to selectively absorb one of ultraviolet light, infrared light, visible light in a red wavelength spectrum of light, visible light in a green wavelength spectrum of light, and visible light in a blue wavelength spectrum of light.

The second active layer may include at least one semiconductor of a second p-type semiconductor and a second n-type semiconductor, the second p-type semiconductor being common with or different from the first p-type semiconductor, the second n-type semiconductor being common with or different from the first n-type semiconductor.

According to some example embodiments, an electronic device including the optoelectronic diode is provided.

According to some example embodiments, an optoelectronic diode, may include a sequential stack of a first electrode, a first active layer, a second electrode, a second active layer, and a third electrode. The optoelectronic diode may include a first diode that includes the first active layer, the first electrode, and the second electrode and a second diode including the second active layer, the second electrode, and the third electrode. The second electrode may have a refractive index that is different from a refractive index of the second active layer.

The optoelectronic diode may further include an anti-reflection layer on a surface of the first electrode. The anti-reflection layer may have a refractive index between about 1.6 to about 2.5. The anti-reflection layer may include at least one material of a metal oxide material, a metal sulfide material, and an organic material.

One electrode, of the first electrode, second electrode, and third electrode, may include a transparent electrode.

The first active layer may include a pn junction. The pn junction may include a first p-type semiconductor and a first n-type semiconductor.

At least one semiconductor of the first p-type semiconductor and the first n-type semiconductor may include a light-absorbing material. The light-absorbing material may be configured to selectively absorb one of ultraviolet light, infrared light, visible light in a red wavelength spectrum of light, visible light in a green wavelength spectrum of light, and visible light in a blue wavelength spectrum of light.

A composition ratio ($p^1/n^1$) of the first p-type semiconductor relative to the first n-type semiconductor may be greater than or equal to about 1.0.

The second active layer may include at least one semiconductor of a second p-type semiconductor and a second n-type semiconductor. The second p-type semiconductor may be common with or different from the first p-type semiconductor. The second n-type semiconductor may be common with or different from the first n-type semiconductor.

The first active layer is proximate to a light receiving side in relation to the second active layer.

An optoelectronic diode having a novel structure may increase light absorbance, efficiency, and wavelength selectivity.

DETAILED DESCRIPTION

Figure 1:
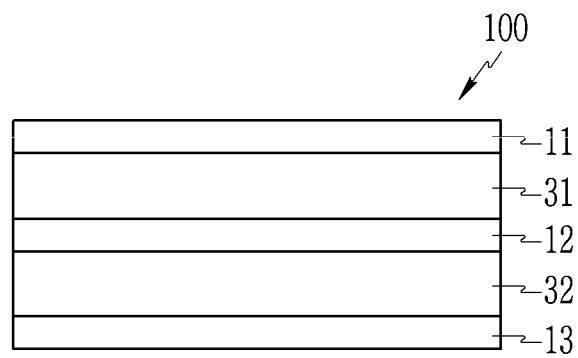
FIG. 1 is a cross-sectional view of an optoelectronic diode according to some example embodiments.

Hereinafter, example embodiments of the present disclosure will be described in detail so that a person skilled in the art would understand the same. This disclosure may, in some example embodiments, be embodied in many different forms and is not construed as limited to the example embodiments set forth herein.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numeral throughout the specification.

Hereinafter, 'combination' refers to a mixture of two or more and a stack structure of two or more.

As used herein, when a definition is not otherwise provided, 'substituted' refers to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, an optoelectronic diode according to some example embodiments is described with reference to the drawings.

Figure 2:
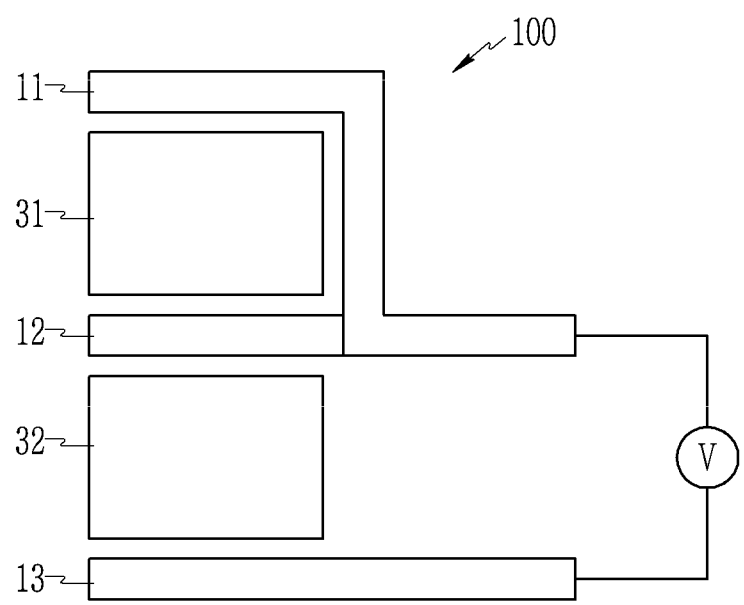
FIG. 2 is a schematic view showing the optoelectronic diode of FIG. 1 according to some example embodiments.
Figure 3:
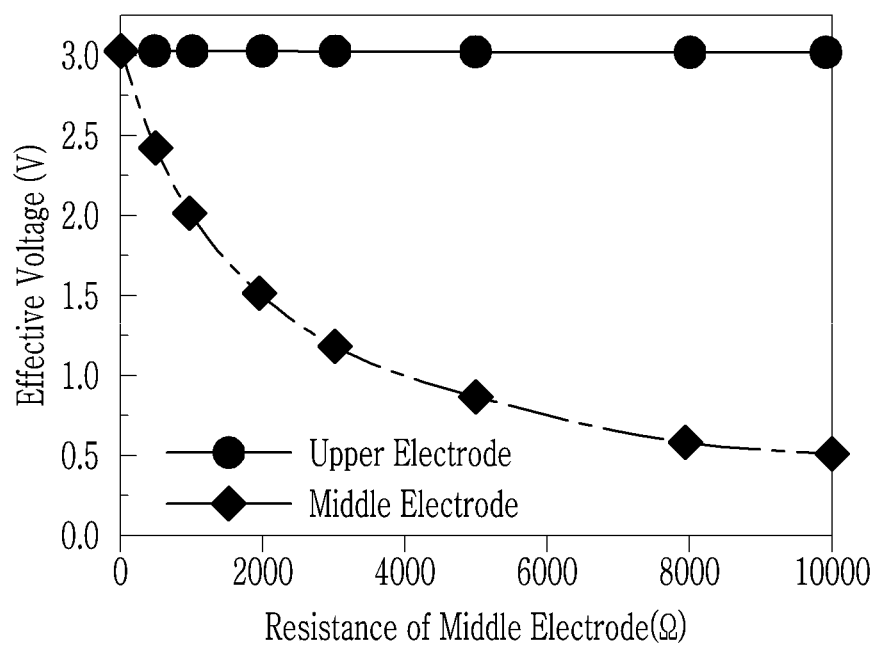
FIG. 3 is a graph showing an effective voltage depending on a resistance of a middle electrode when a common voltage of 3 V is applied to an upper electrode and a middle electrode in the optoelectronic diode of FIG. 2.
Figure 4:
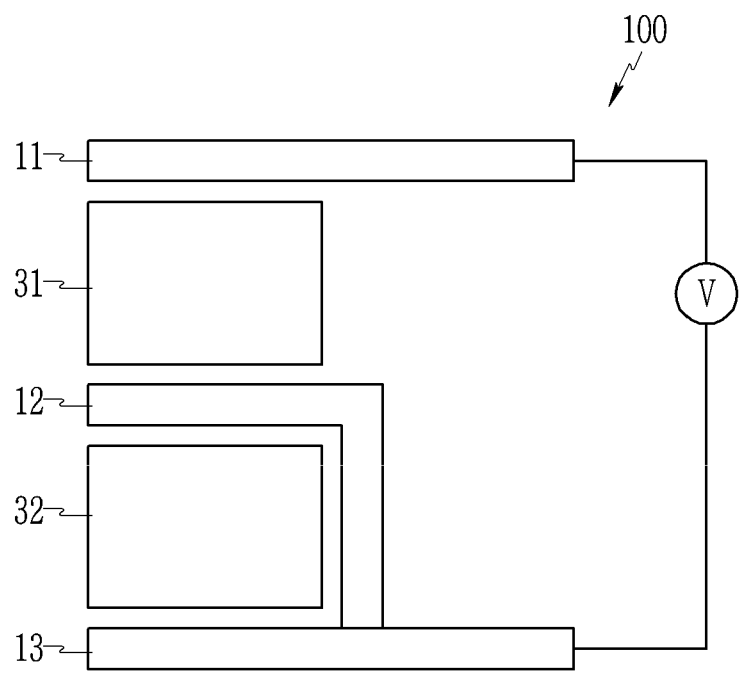
FIG. 4 is a schematic view showing the optoelectronic diode of FIG. 1 according to some example embodiments.
Figure 5:
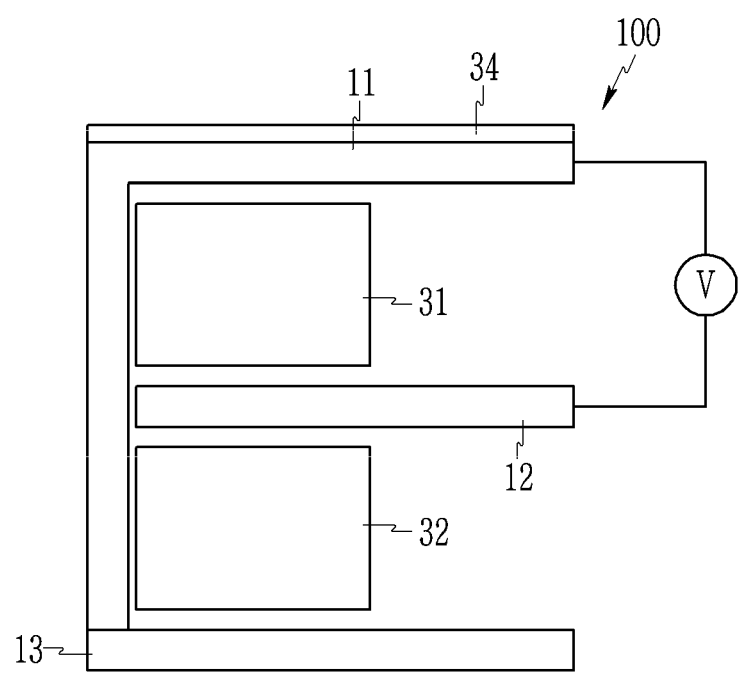
FIG. 5 is a schematic view showing the optoelectronic diode of FIG. 1 according to some example embodiments.

FIG. 1 is a cross-sectional view of an optoelectronic diode according to some example embodiments, FIG. 2 is a schematic view showing the optoelectronic diode of FIG. 1 according to some example embodiments, FIG. 3 is a graph showing an effective voltage depending on a resistance of a middle electrode when a common voltage of 3 V is applied to an upper electrode and a middle electrode in the optoelectronic diode of FIG. 2, FIG. 4 is a schematic view showing the optoelectronic diode of FIG. 1 according to some example embodiments, and FIG. 5 is a schematic view showing the optoelectronic diode of FIG. 1 according to some example embodiments.

Referring to FIG. 1, an optoelectronic diode 100 according to some example embodiments includes an upper electrode 11, a middle electrode 12, a lower electrode 13, an upper active layer 31 between the upper electrode 11 and the middle electrode 12, and a lower active layer 32 between the middle electrode 12 and the lower electrode 13. In some example embodiments, the lower active layer 32 is separated ("isolated") from the upper active layer 31 by at least the middle electrode 12.

A substrate (not shown) may be disposed on a surface of the upper electrode 11 and a surface of the lower electrode 13. The substrate may be, for example, made of ("at least partially comprising") an inorganic material such as glass, an organic material such as polycarbonate, polymethylmethacrylate, polyethyleneterephthalate, polyethylenenaphthalate, polyamide, polyethersulfone, or a combination thereof, or a silicon wafer.

At least one electrode of the upper electrode 11, the middle electrode 12, and lower electrode 13 may be a light-transmitting electrode, and the light-transmitting electrode may be made of ("may at least partially comprise"), for example, a conductive oxide such as indium tin oxide (ITO) or indium zinc oxide (IZO), zinc oxide (ZnO), tin oxide (SnO), aluminum tin oxide (AlTO), and fluorine doped tin oxide (FTO), a metal thin layer of a thin monolayer or multilayer, graphene, or carbon nanotube.

For example, the upper electrode 11 may be a light-transmitting electrode. In another example, the upper electrode 11 may be a light-receiving electrode.

In another example, the middle electrode 12 may be a light-transmitting electrode.

In another example, the upper electrode 11 and the middle electrode 12 may each be a light-transmitting electrode.

In another example, the upper electrode 11, the middle electrode 12, and the lower electrode 13 may each be a light-transmitting electrode.

The upper electrode 11, the upper active layer 31, and the middle electrode 12 may form ("may at least partially comprise") a diode and the lower electrode 13, the lower active layer 32, and the middle electrode 12 may form a diode.

Two electrodes, of the upper electrode 11, the middle electrode 12, and the lower electrode 13 may be electrically connected to each other. The two electrodes electrically connected to each other, of the upper electrode 11, the middle electrode 12, and the lower electrode 13, are a first electrode and a second electrode, and the other electrode of the upper electrode 11, the middle electrode 12, and the lower electrode 13 is a third electrode.

Referring to FIG. 2, the upper electrode 11 and the middle electrode 12 may be electrically connected to each other and a common voltage may be applied thereto. Thus, in FIG. 2, one electrode of the upper electrode 11 and the middle electrode 12 is a first electrode, the other one electrode of the upper electrode 11 and the middle electrode 12 is a second electrode, and the lower electrode 13 is a third electrode. As shown in FIG. 2, the upper electrode 11 and middle electrode 12 may be connected together such that one electrode, of the upper electrode 11 and the middle electrode 12, is electrically connected to the voltage source via the other electrode of the upper electrode 11 and the middle electrode 12. In some example embodiments, the upper electrode 11 is a first electrode and the middle electrode 12 is a second electrode, the resistance of the middle electrode 12 may be higher ("greater") than the resistance of the upper electrode 11, and thus an effective voltage of the middle electrode 12 may be lower than an effective voltage of the upper electrode 11 even if a common voltage is applied to the upper electrode 11 and the middle electrode 12. In this way, a voltage bias difference between the upper electrode 11 and the middle electrode 12 may be present by making the resistances of the upper electrode 11 and the middle electrode 12 different and thus a diode may be formed.

The resistance of the middle electrode 12 may be set so that the voltage bias difference between the upper electrode 11 and the middle electrode 12 may be within the particular (or, alternatively, predetermined) ranges.

FIG. 3 is a graph showing an effective voltage depending on a resistance of the middle electrode 12 when a common voltage of 3 V is applied to the upper electrode 11 and the middle electrode 12 in the optoelectronic diode of FIG. 2.

Referring to FIG. 3, when a common voltage of 3 V is applied to the upper electrode 11 and the middle electrode 12, the upper electrode 11 has an effective voltage of substantially about 3 V but the middle electrode 12 has a lowered effective voltage along the resistance (e.g., the effective voltage of the middle electrode 12 is inversely proportional to the resistance of the middle electrode 12), and for example when the resistance of the middle electrode 12 is greater than about 2,000Ω, an effective voltage of the middle electrode 12 may be less than or equal to about 1.5 V, or for example when the resistance of the middle electrode 12 is about 10,000Ω, the effective voltage of the middle electrode 12 may be about 0.5 V. In this way, even if a common voltage is applied to the upper electrode 11 and the middle electrode 12, a voltage bias difference between the upper electrode 11 and the middle electrode 12 may be present along the resistance of the middle electrode 12 (e.g., a voltage bias difference between the upper electrode 11 and the middle electrode 12 is proportional to the resistance of the middle electrode 12).

The resistance of the middle electrode 12 may be, for example set so that an effective voltage difference between the upper electrode 11 and the middle electrode 12 may be greater than or equal to about 1 V, for example greater than or equal to about 1.5 V.

For example, the resistance of the middle electrode 12 may be greater than about 2,000Ω, for example greater than about 2,000Ω and less than or equal to about 30,000Ω, about 2,200Ω to about 30,000Ω, about 3,000Ω to about 28,000Ω, about 3,000Ω to about 20,000Ω, or about 5,000Ω to about 20,000Ω. In another example, the resistance of the middle electrode 12 may be greater than about 2,000Ω and the resistance of the upper electrode 11 may be less than or equal to about 2,000Ω. In another example the resistance of the middle electrode 12 may be greater than about 2,000Ω and less than or equal to about 30,000Ω and the resistance of the upper electrode 11 may be about 10Ω to about 2,000Ω, or the resistance of the middle electrode 12 may be about 2,200Ω to about 30,000Ω and the resistance of the upper electrode 11 may be about 50Ω to about 2,000Ω. In another example, the middle electrode 12 may include a conductive oxide, a metal thin film, graphene, or a carbon nanotube having a resistance of greater than about 2,000Ω and less than or equal to about 30,000Ω and the, upper electrode 11 may include a conductive oxide, a metal thin film, graphene, or a carbon nanotube having a resistance of about 10Ω to about 2,000Ω. In another example, the middle electrode 12 may include a conductive oxide, a metal thin film, graphene, or carbon nanotube having a resistance of about 2,200Ω to about 30,000Ω and the upper electrode 11 may include a conductive oxide, a metal thin film, graphene, or carbon nanotube having a resistance of about 50Ω to about 2,000Ω. If and/or when the middle electrode 12 has the resistance within the ranges, a sufficient voltage bias difference may be present even if a common voltage is applied to the middle electrode 12 and the upper electrode 11.

Herein, the upper electrode 11 and the middle electrode 12 to which a common voltage may be applied may be a common electrode and the lower electrode 13 may be a pixel electrode that is present in each pixel. A voltage may be applied to one of the common electrode and the pixel electrode or a different voltage may be applied to each of the common electrode and the pixel electrode. For example, sizes of effective voltages of the upper electrode 11, the middle electrode 12, and the lower electrode 13 may be in an order of the upper electrode 11, the middle electrode 12, and the lower electrode 13.

Referring to FIG. 4, the middle electrode 12 and the lower electrode 13 may be electrically connected to each other and a common voltage may be applied thereto. Thus, in FIG. 4, one electrode of the middle electrode 12 and the lower electrode 13 is a first electrode, the other one electrode of the middle electrode 12 and the lower electrode 13 is a second electrode, and the upper electrode 13 is a third electrode. As shown in FIG. 4, the lower electrode 13 and middle electrode 12 may be connected together such that one electrode, of the lower electrode 13 and the middle electrode 12, is electrically connected to the voltage source via the other electrode of the lower electrode 13 and the middle electrode 12. In some example embodiments, the lower electrode 13 is a first electrode and the middle electrode 12 is a second electrode, the resistance of the middle electrode 12 may be higher than the resistance of the lower electrode 13, and thus an effective voltage of the middle electrode 12 may be lower than effective voltage of the lower electrode 13 even if a common voltage is applied to the middle electrode 12 and the lower electrode 13. In this way, a voltage bias difference between the middle electrode 12 and the lower electrode 13 may be present by making the resistances of the middle electrode 12 and the lower electrode 13 different and thus a diode may be formed.

The resistance of the middle electrode 12 may be set so that a voltage bias between the middle electrode 12 and the lower electrode 13 may be greater than or equal to a particular (or, alternatively, predetermined) range, for example an effective voltage difference between the middle electrode 12 and the lower electrode 13 may be greater than or equal to about 1 V, for example greater than or equal to about 1.5 V.

For example, the resistance of the middle electrode 12 may be greater than about 2,000Ω, greater than about 2,000Ω and less than or equal to about 30,000Ω, about 2,200Ω to about 30,000Ω, about 3,000Ω to about 28,000Ω, about 3,000Ω to about 20,000Ω, or about 5,000Ω to about 20,000Ω. In another example, the resistance of the middle electrode 12 may be greater than about 2,000Ω and the resistance of the lower electrode 13 may be less than or equal to about 2,000Ω, or the resistance of the middle electrode 12 may be greater than about 2,000Ω and less than or equal to about 30,000Ω and the resistance of the lower electrode 13 may be about 10Ω to about 2,000Ω, or the resistance of the middle electrode 12 may be about 2,200Ω to about 30,000Ω and the resistance of the lower electrode 13 may be about 50Ω to about 2,000Ω. In some example embodiments, the middle electrode 12 may include a conductive oxide, a metal thin film, graphene, or a carbon nanotube having a resistance of greater than about 2,000Ω and less than or equal to about 30,000Ω and the lower electrode 13 may include a conductive oxide, a metal thin film, graphene, or a carbon nanotube having a resistance of about 10Ω to about 2,000Ω. In some example embodiments, the middle electrode 12 may include a conductive oxide, a metal thin film, graphene, or a carbon nanotube having resistance of about 2,200Ω to about 30,000Ω and the lower electrode 13 may include a conductive oxide, metal thin film, graphene, or a carbon nanotube having a resistance of about 50Ω to 2,000Ω. If and/or when the middle electrode 12 has the resistance within the ranges, a sufficient voltage bias difference may be present even if a common voltage is applied to the middle electrode 12 and the lower electrode 13.

Herein, the middle electrode 12 and the lower electrode 13 to which a common voltage may be applied may be a common electrode and the upper electrode 11 may be a pixel electrode that is present in each pixel. A voltage may be applied to one of the common electrode and the pixel electrode or a different voltage may be applied to each of the common electrode and the pixel electrode. For example, sizes of effective voltages of the upper electrode 11, the middle electrode 12, and the lower electrode 13 may be in an order of the lower electrode 13, the middle electrode 12, and the upper electrode 11.

Referring to FIG. 5, the upper electrode 11 and the lower electrode 13 may be electrically connected to each other and a common voltage may be applied thereto. Thus, in FIG. 5, one electrode of the upper electrode 11 and the lower electrode 13 is a first electrode, the other one electrode of the upper electrode 11 and the lower electrode 13 is a second electrode, and the middle electrode 12 is a third electrode. As shown in FIG. 5, the upper electrode 11 and lower electrode 13 may be connected together such that one electrode, of the upper electrode 11 and the lower electrode 13, is electrically connected to the voltage source via the other electrode of the upper electrode 11 and the lower electrode 13. In some example embodiments, the lower electrode 13 is a first electrode and the upper electrode 11 is a second electrode, the resistance of the upper electrode 11 may be higher than the resistance of the lower electrode 13, and thus an effective voltage of the upper electrode 11 may be lower than effective voltage of the lower electrode 13 even if a common voltage is applied to the upper electrode 11 and the lower electrode 13. In this way, a voltage bias difference between the upper electrode 11 and the lower electrode 13 may be present by making the resistance of the upper electrode 11 and the resistance of the lower electrode 13 be different and thus each diode between the upper electrode 11 and the middle electrode 12 and between the middle electrode 12 and the lower electrode 13 may be formed.

For example, the resistance of the upper electrode 11 may be greater than about 2,000Ω, greater than about 2,000Ω and less than or equal to about 30,000Ω, about 2,200Ω to about 30,000Ω, about 3,000Ω to about 28,000Ω, about 3,000Ω to about 20,000Ω, or about 5,000Ω to about 20,000Ω. In another example, the resistance of the upper electrode 11 may be greater than about 2,000Ω and the resistance of the lower electrode 13 may be less than or equal to about 2,000Ω or the resistance of the upper electrode 11 may be greater than about 2,000Ω and less than or equal to about 30,000Ω and the resistance of the lower electrode 13 may be about 10Ω to about 2,000Ω. In some example embodiments, the middle electrode 12 may include a conductive oxide, a metal thin film, graphene, or a carbon nanotube having a resistance of greater than about 2,000Ω and less than or equal to about 30,000Ω and the upper electrode 11 may include a conductive oxide, a metal thin film, graphene, or a carbon nanotube having a resistance of about 10Ω to about 2,000Ω. In some example embodiments, the middle electrode 12 may include a conductive oxide, a metal thin film, graphene, or a carbon nanotube having a resistance of about 2,200Ω to about 30,000Ω and the upper electrode 11 may include a conductive oxide, a metal thin film, graphene, or a carbon nanotube having a resistance of about 50Ω to about 2,000Ω. If and/or when the upper electrode 11 has the resistance within the ranges, a sufficient voltage bias difference may be present even if a common voltage is applied to the upper electrode 11 and the lower electrode 13. Herein, a voltage between the effective voltage of the upper electrode 11 and the effective voltage of the lower electrode 13 may be applied to the middle electrode 12.

In some example embodiments, the upper electrode 11 is a first electrode and the lower electrode 13 is a second electrode, the resistance of the lower electrode 13 may be higher than the resistance of the upper electrode 11, and thus an effective voltage of the lower electrode 13 may be lower than an effective voltage of the upper electrode 11 even if a common voltage is applied to the lower electrode 13 and the upper electrode 11.

For example, the resistance of the lower electrode 13 may be greater than about 2,000Ω and the resistance of the upper electrode 11 may be less than or equal to about 2,000Ω, within the ranges the resistance of the lower electrode 13 may be greater than about 2,000Ω and less than or equal to about 30,000Ω and the resistance of the upper electrode 11 may be about 10Ω to about 2,000Ω, or the resistance of the lower electrode 13 may be about 2,200Ω to about 30,000Ω and the resistance of the upper electrode 11 may be about 50Ω to 2,000Ω. In some example embodiments, the lower electrode 13 may include a conductive oxide, a metal thin film, graphene, or a carbon nanotube having a resistance of greater than about 2,000Ω and less than or equal to about 30,000Ω and the upper electrode 11 may include a conductive oxide, a metal thin film, graphene, or a carbon nanotube having a resistance of about 10Ω to about 2,000Ω. In some example embodiments, the lower electrode 13 may include a conductive oxide, a metal thin film, graphene, or a carbon nanotube having a resistance of about 2,200Ω to about 30,000Ω and the upper electrode 11 may include a conductive oxide, a metal thin film, graphene, or a carbon nanotube having a resistance of about 50Ω to about 2,000Ω. If and/or when the lower electrode 13 has the resistance within the ranges, a sufficient voltage bias difference may be present even if a common voltage is applied to the upper electrode 11 and the lower electrode 13. Herein, a voltage between the effective voltage of the upper electrode 11 and the effective voltage of the lower electrode 13 may be applied to the middle electrode 12.

Herein, the upper electrode 11 and the lower electrode 13 to which a common voltage may be applied may be a common electrode and the middle electrode 12 may be a pixel electrode that is present in each pixel. A voltage may be applied to one of the common electrode and the pixel electrode or a different voltage may be applied to each of the common electrode and the pixel electrode. For example, sizes of effective voltages of the upper electrode 11, the middle electrode 12, and the lower electrode 13 may be in an order of the upper electrode 11, the middle electrode 12, and the lower electrode 13 or in an order of the lower electrode 13, the middle electrode 12, and the upper electrode 11.

The upper active layer 31 may be a photoelectric conversion layer that is configured to perform photoelectric conversion between the upper electrode 11 and the middle electrode 12. Herein, one of the upper electrode 11 and the middle electrode 12 may be an anode and the other may be a cathode.

For example, the upper active layer 31 may be nearer to a light receiving side than the lower active layer 32 ("proximate to the light receiving side in relation to the lower active layer 32), and thus most light may be absorbed by the upper active layer 31.

The upper active layer 31 is a layer including a first p-type semiconductor and a first n-type semiconductor that form a pn junction, and is configured to absorb external light to generate excitons and then separate the generated excitons into holes and electrons. Separated holes and electrons may be transferred to each of an anode and a cathode.

The first p-type semiconductor and the first n-type semiconductor may include an organic material, an inorganic material, and/or an organic/inorganic material. For example, at least of the first p-type semiconductor and the first n-type semiconductor may include an organic material.

At least one of the first p-type semiconductor and the first n-type semiconductor may include an light-absorbing material that absorb at least one of light in a ultraviolet (UV) region (hereinafter, referred to as 'ultraviolet light'), light in an infrared region (hereinafter, referred to as 'infrared light'), light in a visible wavelength spectrum of light (hereinafter, referred to as 'visible light').

In some example embodiments, at least one of the first p-type semiconductor and the first n-type semiconductor may be a material selectively absorbing one of ultraviolet light, infrared light, visible light in a red wavelength spectrum of light, visible light in a green wavelength spectrum of light, and visible light in a blue wavelength spectrum of light. In some example embodiments, the first p-type semiconductor may be a material selectively absorbing one of ultraviolet light, infrared light, visible light in a red wavelength spectrum of light, visible light in a green wavelength spectrum of light, and visible light in a blue wavelength spectrum of light.

In some example embodiments, at least one of the first p-type semiconductor and the first n-type semiconductor may be a material configured to selectively absorb one of visible light in a red wavelength spectrum of light, visible light in a green wavelength spectrum of light, and visible light in a blue wavelength spectrum of light. In some example embodiments, the first p-type semiconductor may be a material configured to selectively absorb one of visible light in a red wavelength spectrum of light, visible light in a green wavelength spectrum of light, and visible light in a blue wavelength spectrum of light.

In some example embodiments, the first p-type semiconductor may be a material configured to selectively absorb one of visible light in a red wavelength spectrum of light, visible light in a green wavelength spectrum of light, and visible light in a blue wavelength spectrum of light and the first n-type semiconductor may be fullerene or a fullerene derivative.

In some example embodiments, the first p-type semiconductor may be a light-absorbing material configured to selectively absorb green light having a maximum absorption wavelength ($\lambda_{max}$) of about 520 nm to about 580 nm and the first n-type semiconductor may be fullerene or a fullerene derivative.

The first p-type semiconductor and the first n-type semiconductor may be mixed in a form of a bulk heterojunction, wherein the first p-type semiconductor and the first n-type semiconductor may be, for example in a volume ratio of about 1:10 to about 10:1, about 2:8 to about 8:2, about 3:7 to about 7:3, or about 4:6 to about 6:4.

In some example embodiments, the first p-type semiconductor may be included in the same amount as or greater amount than the first n-type semiconductor, and for example a composition ratio ($p^1/n^1$) of the first p-type semiconductor relative to the first n-type semiconductor of the upper active layer 31 may be greater than or equal to about 1.0. In some example embodiments, the composition ratio ($p^1/n^1$) of the first p-type semiconductor relative to the first n-type semiconductor of the upper active layer 31 may be about 1.0 to about 10.0, for example about 1.0 to about 5.0, about 1.0 to about 3.5, about 1.1 to about 3.5, or about 1.1 to about 3.0.

The upper active layer 31 may have a thickness of about 5 nm to about 200 nm.

The lower active layer 32 is between the middle electrode 12 and the lower electrode 13 and may transfer holes or electrons transferred from upper active layer 31 through the middle electrode 12 to the lower electrode 13.

The lower active layer 32 may include a second p-type semiconductor and/or a second n-type semiconductor, and the second p-type semiconductor may be the same as or different from the first p-type semiconductor and the second n-type semiconductor may be the same as or different from the first n-type semiconductor.

Remaining light not being absorbed in the upper active layer 31 may pass ("propagate," "flow," etc.) into the lower active layer 32, and light passing into the lower active layer 32 may be reflected into the upper active layer 31 due to a difference of a refractive index on the interface of the lower active layer 32 and the middle electrode 12. Accordingly, an amount of light absorbed by the upper active layer 31 may be increased.

The lower active layer 32 may be thinner than the upper active layer 31 and may have a thickness, for example about 2 nm to about 150 nm.

A charge auxiliary layer (not shown) may be between the upper electrode 11 and the upper active layer 31, between the middle electrode 12 and the upper active layer 31, between the middle electrode 12 and the lower active layer 32, and/or between the lower electrode 13 and the lower active layer 32.

The charge auxiliary layer may facilitate transfer of holes and/or electrons and increase efficiency.

The charge auxiliary layer may include at least one of a hole injection layer configured to facilitate hole injection, a hole transport layer configured to facilitate hole transport, an electron blocking layer configured to prevent electron transport, an electron injection layer configured to facilitate electron injection, an electron transport layer configured to facilitate electron transport, and a hole blocking layer configured to prevent hole transport, but is not limited thereto.

The charge auxiliary layer may include for example an organic material, an inorganic material, or an organic/inorganic material. The organic material may be an organic compound having hole or electron characteristics, and the inorganic material may be, for example, a metal oxide such as molybdenum oxide, tungsten oxide, nickel oxide, and the like.

The optoelectronic diode 100 may further include an anti-reflection layer 34 on one surface of the upper electrode 11 or the lower electrode 13 shown in FIG. 5 as being on a surface of the upper electrode 11. The anti-reflection layer is disposed at a light incidence side and lowers reflectance of light of incident light and thereby light absorbance is further improved. For example, when light enters from the upper electrode 11, the anti-reflection layer 34 may be disposed on the upper electrode 11 while when light enters from the lower electrode 13, the anti-reflection layer 34 may be disposed under the lower electrode 13.

The anti-reflection layer 34 may include a material having a refractive index of about 1.6 to about 2.5, and may include at least one material of a metal oxide material, a metal sulfide material, and an organic material having a refractive index within the ranges. The anti-reflection layer may include a metal oxide including an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof; a metal sulfide such as zinc sulfide; or an organic material such as an amine derivative, but is not limited thereto.

In this way, the optoelectronic diode according to some example embodiments includes the middle electrode 12 between the upper active layer 31 and the lower active layer 32 and thereby light may be reflected to the upper active layer 31 due to a difference between refractive indexes of the middle electrode 12 and the lower active layer 32 and light absorption characteristics of the upper active layer 31 may be increased, and simultaneously a transport path of charges may be decreased by dividing the active layer into two regions and thereby photoelectric conversion efficiency associated with the optoelectronic diode 100 may be increased. In addition, two of the upper electrode 11, the middle electrode 12, and the lower electrode 13 are electrically connected to each other and a common voltage is applied, and a voltage bias difference may be present based on resistances of two electrodes to which a common voltage is applied being different, such that the two electrodes have different effective voltages and thus a diode may be formed.

The optoelectronic diode 100 may be applied to ("included in") various electronic devices configured to utilize photoelectric conversion or photoluminescence, and may be for example applied to a solar cell, an image sensor, a photo-detector, a photo-sensor, and an organic light emitting diode (OLED), but is not limited thereto.

For example, the optoelectronic diode 100 may be applied to an image sensor.

Hereinafter, an example of an image sensor including the optoelectronic diode 100 is described referring to drawings. As an example of an image sensor, a CMOS image sensor is illustrated.

Figure 6:
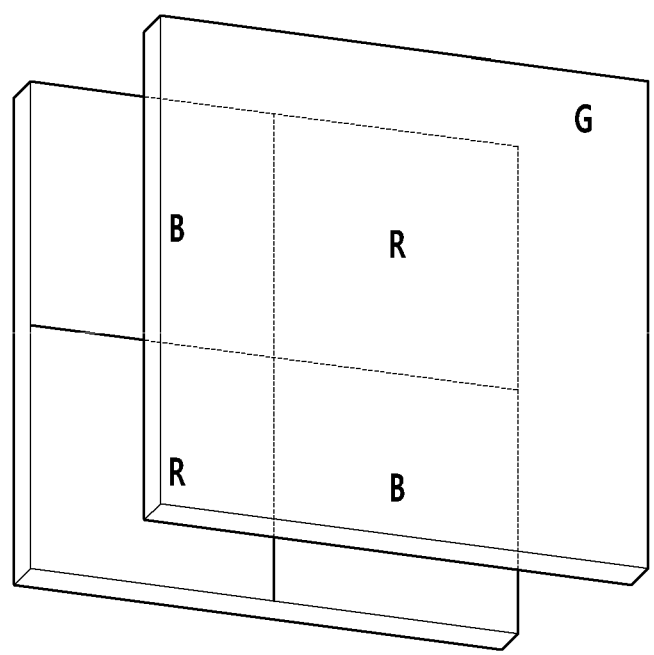
FIG. 6 is a schematic top plan view of an organic CMOS image sensor according to some example embodiments.
Figure 7:
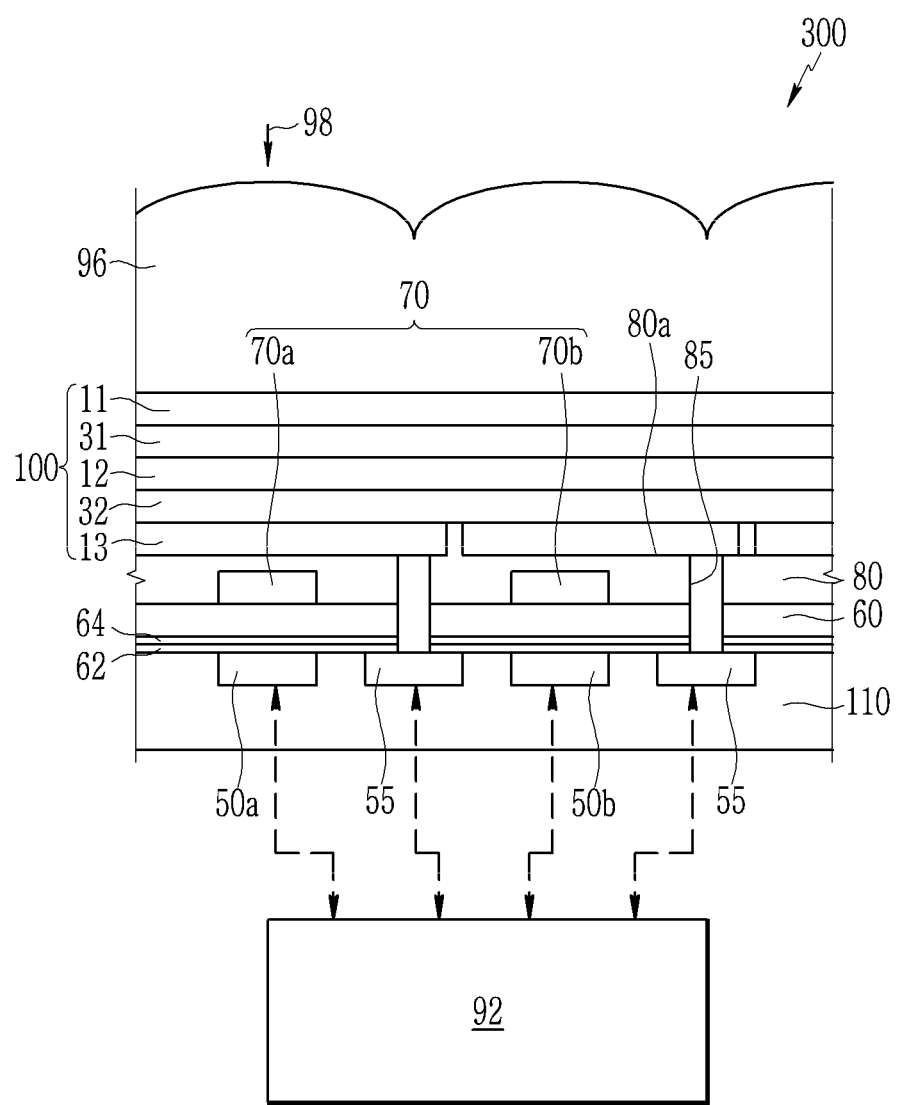
FIG. 7 is a cross-sectional view showing the organic CMOS image sensor of FIG. 6 according to some example embodiments.

FIG. 6 is a schematic top plan view of an organic CMOS image sensor according to some example embodiments and FIG. 7 is a cross-sectional view showing one example of the organic CMOS image sensor of FIG. 6.

Referring to FIGS. 6 and 7, a CMOS image sensor 300 according to some example embodiments includes a semiconductor substrate 110 integrated with photo-sensing devices 50a and 50b, a transmission transistor 92, and a charge storage 55, a lower insulation layer 60, a color filter layer 70, an upper insulation layer 80, and an optoelectronic diode 100.

The semiconductor substrate 110 may be a silicon substrate, and is integrated with the photo-sensing devices 50a and 50b, the transmission transistor 92 and the charge storage 55. The photo-sensing devices 50a and 50b may be photodiodes.

The photo-sensing devices 50a and 50b, the transmission transistor, and/or the charge storage 55 may be integrated in each pixel, and the photo-sensing devices 50a and 50b may be included in a blue pixel and a red pixel and the charge storage 55 may be included in a green pixel.

The photo-sensing devices 50a and 50b sense light, the information sensed by the photo-sensing devices may be transferred by the transmission transistor, the charge storage 55 is electrically connected to the optoelectronic diode 100, and the information of the charge storage 55 may be transferred by the transmission transistor.

A metal wire 62 and a pad 64 are formed on the semiconductor substrate 110. In order to decrease signal delay, the metal wire and pad may be made of ("may at least partially comprise") a metal having low resistivity, for example, aluminum (Al), copper (Cu), silver (Ag), and alloys thereof, but is not limited thereto. In some example embodiments, and the metal wire 62 and pad 64 may be disposed under the photo-sensing devices 50a and 50b.

The lower insulation layer 60 may be formed on the metal wire 62 and the pad 64. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench (through-hole 85) exposing the charge storage 55. The trench may be filled with fillers.

A color filter layer 70 is formed on the lower insulation layer 60. The color filter layer 70 includes a blue filter 70a formed in the blue pixel and a red filter 70b formed in the red pixel. In some example embodiments, a green filter is not included, but a green filter may be further included.

The upper insulation layer 80 is formed on the color filter layer 70. The upper insulation layer 80 eliminates a step caused by the color filter layer 70 and smoothes the surface 80a. The upper insulation layer 80 and lower insulation layer 60 may include a contact hole (not shown) exposing a pad, and a through-hole 85 exposing the charge storage 55 of a green pixel.

The optoelectronic diode 100 is formed on the upper insulation layer 80.

The optoelectronic diode 100 includes the upper electrode 11, the upper active layer 31, the middle electrode 12, the lower active layer 32, and the lower electrode 13 as described above.

The upper electrode 11, the middle electrode 12, and the lower electrode 13 may be all light-transmitting electrodes and the upper active layer 31 and/or the lower active layer 32 may include, for example a light-absorbing material selectively absorbing visible light in a green wavelength spectrum of light.

Visible light in a green wavelength spectrum of light of light that enters from the upper electrode 11 is mainly absorbed by the upper active layer 31 and photoelectrically converted, and remaining light is transmitted through the middle electrode 12, and remaining visible light in a green wavelength spectrum of light may be absorbed by the lower active layer 32 or may be reflected to the upper active layer 31 and light except the visible light in a green wavelength spectrum of light is transmitted through the lower electrode 13 and is sensed by the photo-sensing devices 50a and 50b.

Focusing lens 96 may be further formed on the optoelectronic diode 100. The focusing lens 96 may control a direction of incident light 98 and gather the light in one region. The focusing lens 96 may have a shape of, for example, a cylinder or a hemisphere, but is not limited thereto.

As described above, the optoelectronic diode 100 is stacked on the semiconductor substrate 110 integrated with the photo-sensing devices 50a and 50b and thereby the size of an image sensor may be reduced to realize a down-sized image sensor. In FIG. 7, the optoelectronic diode of FIG. 2 is for example included, but it is not limited thereto, and thus the optoelectronic diodes of FIG. 4 or 5 may be applied in the same manner.

In FIGS. 6 and 7, visible light in a green wavelength spectrum of light is absorbed by the optoelectronic diode 100, and visible light in a red wavelength spectrum of light and visible light in a blue wavelength spectrum of light are sensed by the photo-sensing devices 50a and 50b, but the present disclosure is not limited thereto. Visible light in a red wavelength spectrum of light may be absorbed by the optoelectronic diode 100 and visible light in a green wavelength spectrum of light and visible light in a blue wavelength spectrum of light may be sensed by the photo-sensing devices 50a and 50b and visible light in a blue wavelength spectrum of light may be sensed by optoelectronic diode 100 and visible light in a green wavelength spectrum of light and visible light in a red wavelength spectrum of light may be sensed by the photo-sensing devices 50a and 50b.

Figure 8:
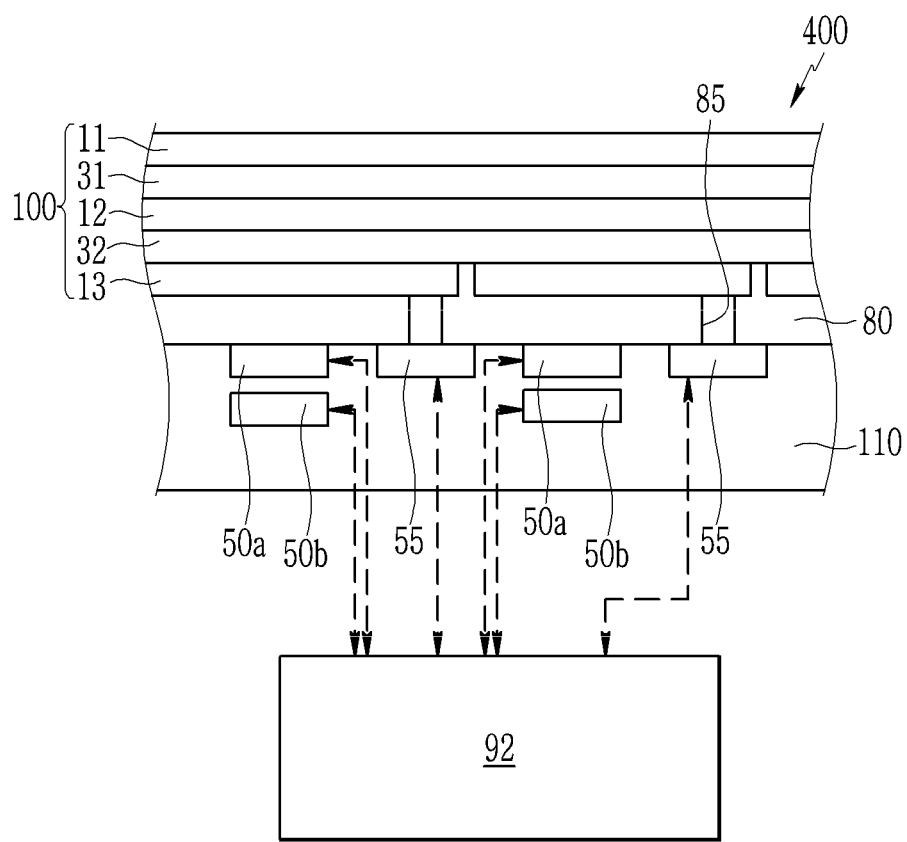
FIG. 8 is a cross-sectional view showing the organic CMOS image sensor of FIG. 6 according to some example embodiments.

FIG. 8 is a cross-sectional view showing the organic CMOS image sensor of FIG. 6 according to some example embodiments.

The organic CMOS image sensor 400 according to some example embodiments includes the semiconductor substrate 110 in which the photo-sensing devices 50a and 50b, a transmission transistor 92 and the charge storage 55 are integrated, the upper insulation layer 80 having the through-hole 85, and the optoelectronic diode 100.

In some example embodiments, in the CMOS image sensor 400, the photo-sensing devices 50a and 50b are stacked in a vertical direction, but the color filter layer 70 is omitted. The photo-sensing devices 50a and 50b are electrically connected to charge storage 55 and may be transferred by the transmission transistor. The photo-sensing devices 50a and 50b may selectively absorb light in each wavelength spectrum of light depending on a stacking depth.

Focusing lens (not shown) may be further formed on the optoelectronic diode 100. The focusing lens may control a direction of incident light and gather the light in one region. The focusing lens may have a shape of, for example, a cylinder or a hemisphere, but is not limited thereto.

As described above, the semiconductor substrate 110 and the optoelectronic diode 100 have a stack structure and the photo-sensing devices 50a and 50b have a stack structure and thereby the size of an image sensor may be reduced to realize a down-sized image sensor. In FIG. 8, the optoelectronic diode of FIG. 2 is for example included, but it is not limited thereto, and thus the optoelectronic diodes of FIG. 4 or 5 may be applied in the same manner.

Figure 9:
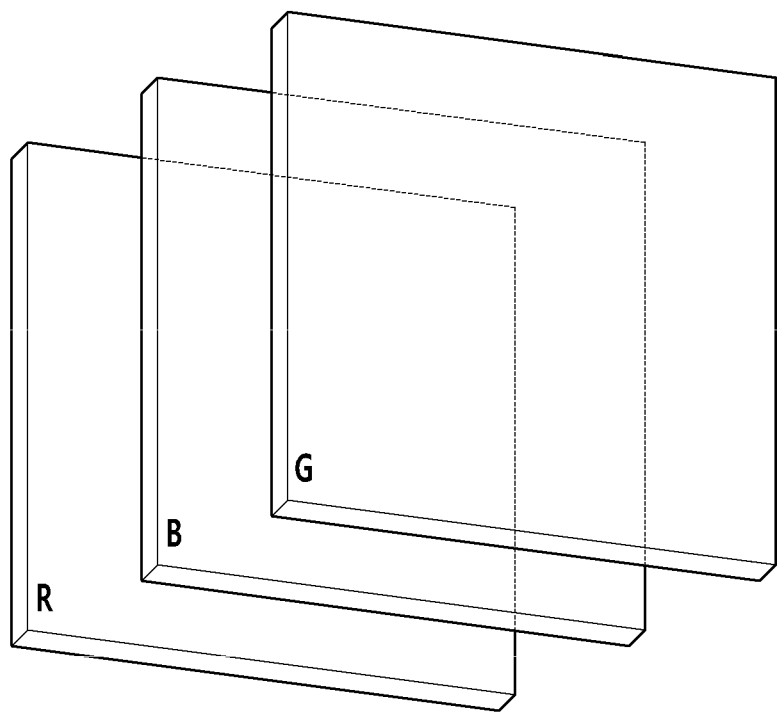
FIG. 9 is a schematic top plan view of an organic CMOS image sensor according to some example embodiments.
Figure 10:
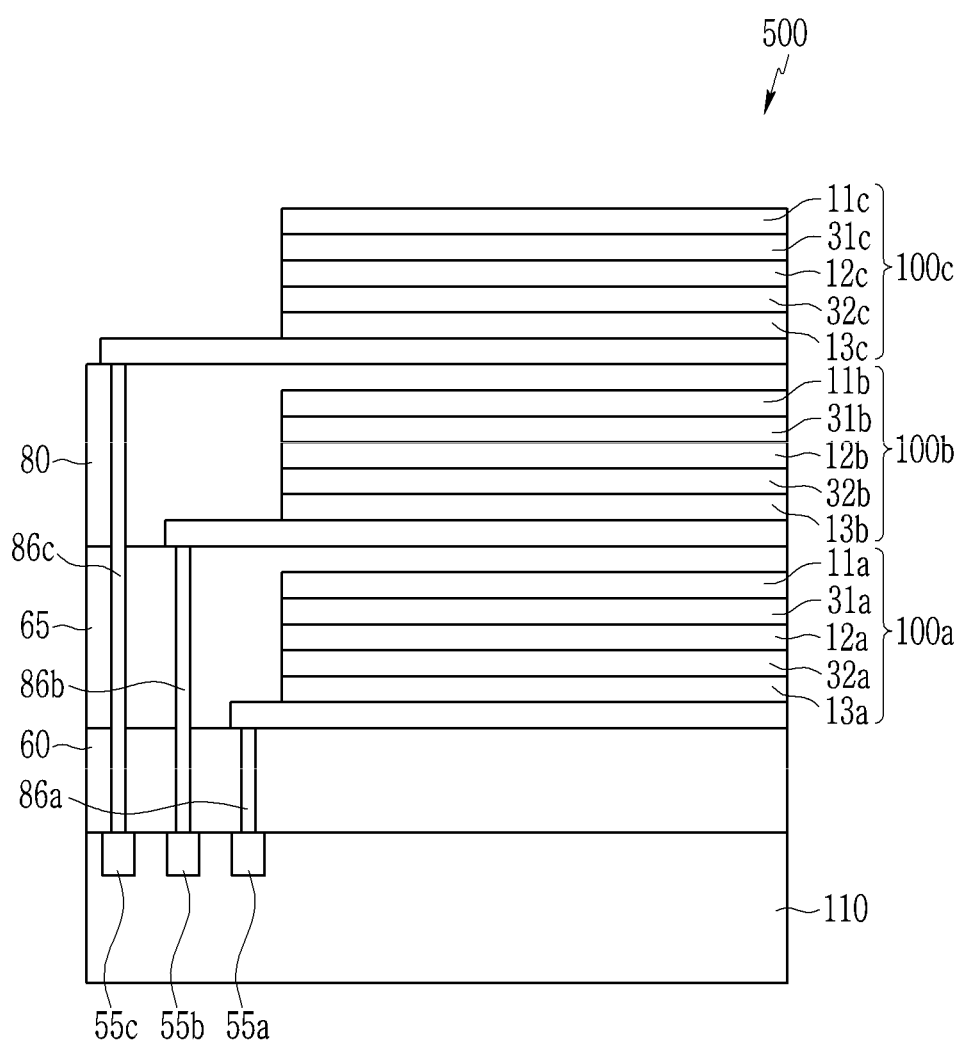
FIG. 10 is a cross-sectional view of the organic CMOS image sensor of FIG. 9.

FIG. 9 is a schematic top plan view of an organic CMOS image sensor according to some example embodiments and FIG. 10 is a cross-sectional view of the organic CMOS image sensor of FIG. 9.

The organic CMOS image sensor 500 according to some example embodiments includes a semiconductor substrate 110, a lower insulation layer 60, an intermediate insulation layer 65, a upper insulation layer 80, a first optoelectronic diode 100a, a second optoelectronic diode 100b, and a third optoelectronic diode 100c.

The semiconductor substrate 110 may be a silicon substrate, and is integrated with the transmission transistor (not shown) and the charge storages 55a, 55b, and 55c.

A metal line (not shown) and pad (not shown) are formed on the semiconductor substrate 110 and a lower insulation layer 60 is formed on the metal line and pad.

The first optoelectronic diode 100a is formed on the lower insulation layer 60.

The first optoelectronic diode 100a includes a upper electrode 11a, a middle electrode 12a, a lower electrode 13a, a upper active layer 31a disposed between the upper electrode 11a and the middle electrode 12a, and a lower active layer 32a between the lower electrode 13a and the middle electrode 12a. The upper electrode 11a, the middle electrode 12a, the lower electrode 13a, the upper active layer 31a, and the lower active layer 32a are the same as described above, and the upper active layer 31a may selectively absorb light in one wavelength spectrum of light of red, blue and green. The lower active layer 32a may selectively absorb light in the same wavelength spectrum of light as the upper active layer 31a. For example, the first optoelectronic diode 100a may be a red photoelectric diode.

The intermediate insulation layer 65 is formed on the first optoelectronic diode 100a.

The second optoelectronic diode 100b is formed on the intermediate insulation layer 65.

The second optoelectronic diode 100b includes a upper electrode 11b, a middle electrode 12b, a lower electrode 13b, a upper active layer 31b disposed between the upper electrode 11b and the middle electrode 12b, and a lower active layer 32b disposed between the lower electrode 13b and the middle electrode 12b. The upper electrode 11b, the middle electrode 12b, the lower electrode 13b, the upper active layer 31b, and the lower active layer 32b are the same as described above, and the upper active layer 31b may selectively absorb light in one wavelength spectrum of light of red, blue and green. The lower active layer 32b may selectively absorb light in the same wavelength spectrum of light as the upper active layer 31b. For example, the second optoelectronic diode 100b may be a blue photoelectric diode.

The upper insulation layer 80 is formed on the second optoelectronic diode 100b. The lower insulation layer 60, the intermediate insulation layer 65, and the upper insulation layer 80 have a plurality of through-holes 86a, 86b, 86c exposing the charge storages 55a, 55b, and 55c, respectively.

The third optoelectronic diode 100c is formed on the upper insulation layer 80.

The third optoelectronic diode 100c includes a upper electrode 11c, a middle electrode 12c, a lower electrode 13c, a upper active layer 31c disposed between the upper electrode 11c and the middle electrode 12c, and a lower active layer 32c disposed between the lower electrode 13c and the middle electrode 12c. The upper electrode 11c, the middle electrode 12c, the lower electrode 13c, the upper active layer 31c, and the lower active layer 32c are the same as described above, and the upper active layer 31c may selectively absorb light in one wavelength spectrum of light of red, blue and green. The lower active layer 32c or the upper active layer 31c may selectively absorb light in the same wavelength spectrum of light. For example, the third optoelectronic diode 100c may be a green photoelectric diode.

Focusing lens (not shown) may be further formed on the third optoelectronic diode 100c. The focusing lens may control a direction of incident light and gather the light in one region. The focusing lens may have a shape of, for example, a cylinder or a hemisphere, but is not limited thereto.

In the drawing, the first optoelectronic diode 100a, the second optoelectronic diode 100b, and the third optoelectronic diode 100c are for example the optoelectronic diode of FIG. 2 but the present disclosure is not limited thereto. One or two of the first optoelectronic diode 100a, the second optoelectronic diode 100b, and the third optoelectronic diode 100c may be one of the optoelectronic diodes of FIGS. 2, 4, and 5.

In the drawing, the first optoelectronic diode 100a, the second optoelectronic diode 100b, and the third optoelectronic diode 100c are sequentially stacked, but the present disclosure is not limited thereto, and they may be stacked in various orders.

As described above, the first optoelectronic diode 100a, the second optoelectronic diode 100b, and the third optoelectronic diode 100c that absorb light in different wavelength spectra of light have a stack structure, and thus the size of an image sensor may be reduced to realize a down-sized image sensor.

The image sensor may be applied to, for example, various electronic devices such as a mobile phone or a digital camera, but is not limited thereto.

Hereinafter, the embodiments are illustrated in more detail with reference to examples. In some example embodiments, these examples are exemplary, and the scope of claims is not limited thereto.

Manufacture of Optoelectronic Diode I

Example 1

A 150 nm-thick lower electrode (resistance: 50Ω) is formed by sputtering ITO on a glass substrate. The lower electrode is formed by using sputtering equipment made by Applied Materials Inc. at room temperature with DC power of 1,300 W. Subsequently, an 85 nm-thick lower active layer is formed on the lower electrode by co-depositing a compound represented by Chemical Formula A as a p-type semiconductor and C60 as a n-type semiconductor in a volume ratio of 1:1. On the lower active layer, a 7 nm-thick middle electrode (resistance: 10,000≠) is formed by depositing ITO through sputtering. The middle electrode is formed by using sputtering equipment made by A-Tech Inc. at room temperature with DC power of 250 W at an $O_2$ flow rate of 0.10 SCCM. Subsequently, on the middle electrode, an 85 nm-thick upper active layer was formed by co-depositing a compound represented by Chemical Formula A as a p-type semiconductor and C60 as an n-type semiconductor in a volume ratio of 1:1. On the upper active layer, a 10 nm-thick charge auxiliary layer is formed by using molybdenum oxide (MoOx, 0<x≤3). On the charge auxiliary layer, a 7 nm-thick upper electrode (resistance: 2,000Ω) is formed by depositing ITO through sputtering to ultimately manufacture an optoelectronic diode. The upper electrode is formed by using sputtering equipment made by A-Tech Inc. at room temperature with 250 W of DC power at an O2 flow rate of 0.20 SCCM, and the terminal end of the middle electrode is connected to the terminal end of the upper electrode.

[Chemical Formula A]

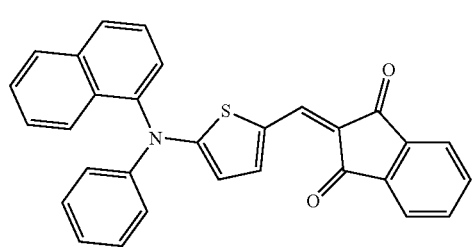

Example 2

An optoelectronic diode is manufactured according to the same method as Example 1 except for forming the upper active layer by co-depositing the p-type semiconductor and the n-type semiconductor in a volume ratio of 1.2:1.

Example 3

An optoelectronic diode is manufactured according to the same method as Example 1 except for forming the lower active layer by codepositing the p-type semiconductor and the n-type semiconductor in a volume ratio of 1.2:1.

Example 4

An optoelectronic diode is manufactured according to the same method as Example 1 except for respectively forming the lower and upper active layers by codepositing the p-type semiconductor and the n-type semiconductor in a volume ratio of 1.2:1.

Comparative Example 1

A 150 nm-thick lower electrode (resistance: 50Ω) is formed by sputtering ITO on a glass substrate. Subsequently, on the lower electrode, an 85 nm-thick active layer is formed by co-depositing a compound represented by Chemical Formula A as a p-type semiconductor and C60 as an n-type semiconductor in a volume ratio of 1:1. Subsequently, on the active layer, a 10 nm-thick charge auxiliary layer is formed by using molybdenum oxide (MoOx, 0<x≤3). On the charge auxiliary layer, a 7 nm-thick upper electrode (resistance: 10,000≠) is formed by depositing ITO through sputtering to ultimately manufacture an optoelectronic diode. Herein, a lower electrode is formed by using sputtering equipment made by Applied Materials Inc. at room temperature with 1,300 W of DC power, while an upper electrode is formed by using sputtering equipment made by A-Tech Inc. at room temperature with 250 W of DC power at an O2 flow rate of 0.10 SCCM.

Comparative Example 2

An optoelectronic diode is manufactured according to the same method as Comparative Example 1 except for forming the active layer by codepositing the p-type semiconductor and the n-type semiconductor in a volume ratio of 1.2:1.

Evaluation I
Evaluation 1

Light absorption characteristics of the optoelectronic diodes according to Example 4 and Comparative Example 2 are evaluated.

The light absorption characteristics are evaluated by using UV-2450 made by Shimadzu Corp.

Figure 11:
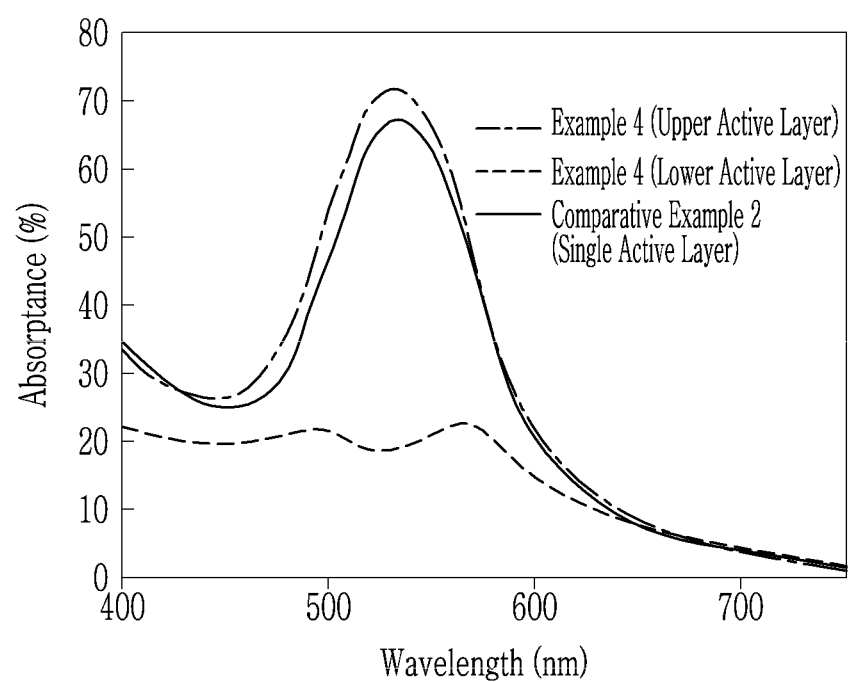
FIG. 11 is a graph showing light absorption characteristics depending on a wavelength of the optoelectronic diodes according to Example 4 and Comparative Example 2.

FIG. 11 is a graph showing the light absorption characteristics of the optoelectronic diodes according to Example 4 and Comparative Example 2 depending on a wavelength.

Referring to FIG. 11, the upper active layer of the optoelectronic diode according to Example 4 shows higher absorbance at a maximum absorption wavelength ($\lambda_{max}$) than the active layer of the optoelectronic diode according to Comparative Example 2.

Accordingly, the upper active layer of the optoelectronic diode according to Example 4 shows improved absorbance due to reflection of the lower active layer.

Evaluation 2

External quantum efficiency (EQE) of the optoelectronic diodes according to Examples 1 to 4 and Comparative Example 1 is evaluated.

The external quantum efficiency is evaluated in an Incident Photon to Current Efficiency (IPCE) method in a wavelength spectrum of light ranging from 400 nm to 720 nm ($\lambda_{max}$=530 nm). A reference wavelength of a green wavelength spectrum of light is about 530 nm as a maximum absorption wavelength ($\lambda_{max}$), and a reference wavelength of a blue wavelength spectrum of light is 450 nm.

As for a voltage, 0 V is applied to the lower electrode, while 3 V is applied to the upper electrode.

The results are shown in Table 1.

TABLE 1

| | $EQE_{max(G)}$ (%) | $EQE_{450\ nm(B)}$ (%) | $EQE_{max(G)}/EQE_{450\ nm(B)}$ |
|---|---|---|---|
| Example 1 | 51.4 | 13.6 | 3.78 |
| Example 2 | 50.7 | 13.3 | 3.81 |
| Example 3 | 52.3 | 13.2 | 3.96 |
| Example 4 | 52.4 | 13.0 | 4.03 |
| Comparative Example 1 | 47.0 | 16.4 | 2.87 |

Referring to Table 1, the optoelectronic diodes according to Examples 1 to 4 shows increase green light absorption but decreased blue light absorption and thus improved wavelength selectivity about green light compared with the optoelectronic diode according to Comparative Example 1.

Manufacture of Optoelectronic Diode II

Example 5

An optoelectronic diode is manufactured according to the same method as Example 1 except for forming a middle electrode having resistance of 2,200Ω by changing the O2 flow rate into 0.25 SCCM.

Example 6

An optoelectronic diode is manufactured according to the same method as Example 1 except for forming a middle electrode having resistance of 8,000Ω by changing the O2 flow rate into 0.08 SCCM.

Example 7

An optoelectronic diode is manufactured according to the same method as Example 1 except for forming a middle electrode having resistance of 28,000Ω by changing the $O_2$ flow rate into 0 SCCM.

Evaluation II

External quantum efficiency (EQE) of the optoelectronic diodes according to Examples 5 to 7 and Comparative Example 1 is evaluated.

The external quantum efficiency is evaluated in an Incident Photon to Current Efficiency (IPCE) method in a wavelength spectrum of light ranging from 400 nm to 720 nm ($\lambda_{max}$=530 nm) and normalized to be 1.0 at the maximum absorption wavelength.

As for a voltage, 0 V is applied to the lower electrode, while 10 V is applied to the upper electrode.

Figure 12:
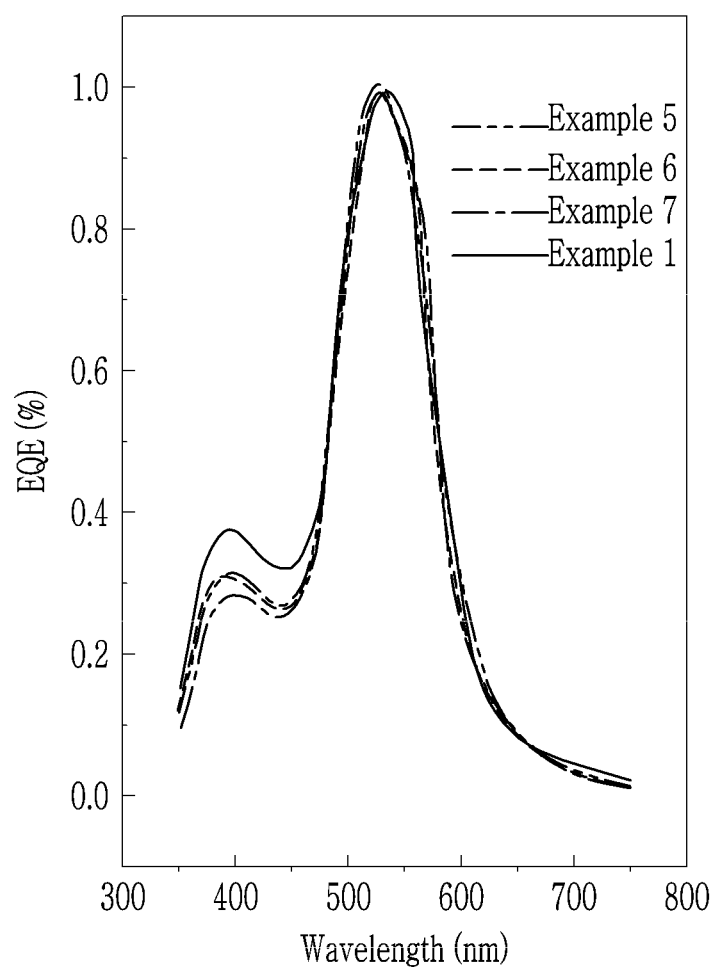
FIG. 12 is a graph showing external quantum efficiency depending on a wavelength of the optoelectronic diodes according to Examples 5 to 7 and Comparative Example 1.

The results are shown in FIG. 12.

FIG. 12 is a graph showing external quantum efficiency depending on a wavelength of the optoelectronic diodes according to Examples 5 to 7 and Comparative Example 1.

Referring to FIG. 12, the optoelectronic diodes according to Examples 5 to 7 show relatively low external quantum efficiency of blue light and thus improved wavelength selectivity of green light compared with the optoelectronic diode according to Comparative Example 1.

Manufacture of Optoelectronic Diode III

Example 8

A 150 nm-thick lower electrode (resistance: 50Ω) is formed by sputtering ITO on a glass substrate. The lower electrode is formed by using sputtering equipment made by Applied Materials Inc. at room temperature with 1,300 W of DC power. On the lower electrode, a lower active layer is formed by co-depositing a compound represented by Chemical Formula B as a p-type semiconductor and C60 as a n-type semiconductor in a volume ratio of 2.5:1. The lower active layer may have various thicknesses of 40 nm, 60 nm, and 80 nm. Subsequently, on the lower active layer, a 7 nm-thick middle electrode (resistance: 28,000Ω) is formed by depositing ITO through sputtering. The middle electrode is formed by using sputtering equipment made by A-Tech Inc. at room temperature with 250 W of DC power at an $O_2$ flow rate of 0 SCCM. On the middle electrode, an upper active layer is formed by co-depositing a compound represented by Chemical Formula B as a p-type semiconductor and C60 as an n-type semiconductor in a volume ratio of 2.5:1. The upper active layer may have a thickness ranging from 50 nm to 120 nm. Subsequently, on the upper active layer, a 10 nm-thick charge auxiliary layer is formed by using molybdenum oxide (MoOx, 0<x≤3). On the charge auxiliary layer, a 7 nm-thick upper electrode (resistance: 2000Ω) is formed by depositing ITO through sputtering to ultimately manufacture an optoelectronic diode. The upper electrode is formed by using sputtering equipment made by A-Tech Inc. at room temperature with 250 W of DC power at an $O_2$ flow rate of 0.2 SCCM, and the terminal end of the middle electrode is connected to the terminal end of the upper electrode.

[Chemical Formula B]

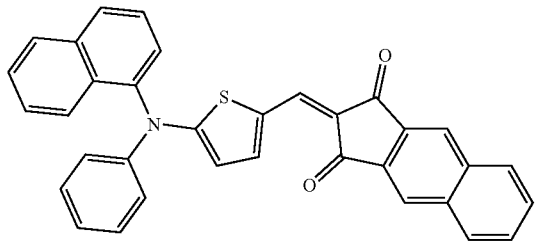

Comparative Example 3

An optoelectronic diode is manufactured according to the same method as Example 8 except for forming neither lower active layer nor middle electrode.

Evaluation III

Absorbance of the optoelectronic diodes according to Example 8 and Comparative Example 3 is evaluated.

Figure 13:
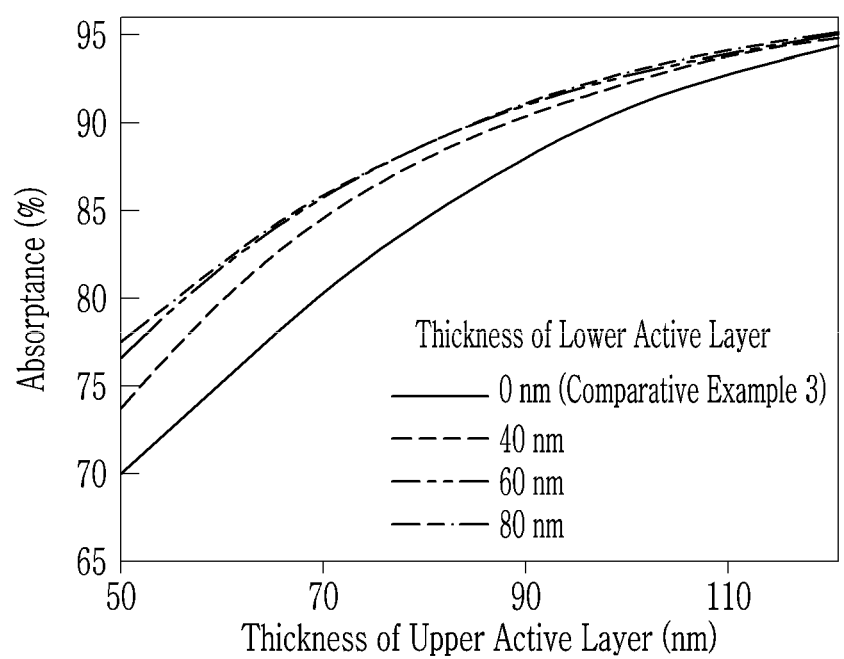
FIG. 13 is a graph showing absorbance changes depending on a thickness of an active layer in the optoelectronic diodes according to Example 8 and Comparative Example 3.

FIG. 13 is a graph showing absorbance changes depending on a thickness of an active layer in the optoelectronic diodes according to Example 8 and Comparative Example 3.

Referring to FIG. 13, the optoelectronic diode of Example 8 shows increased absorbance depending on thicknesses of the upper active layer and the lower active layer and higher absorbance than the optoelectronic diode (a lower active layer: 0 nm) according to Comparative Example 3. Particularly, when the upper active layer is thin, absorbance is much largely increased.

Figure 14:
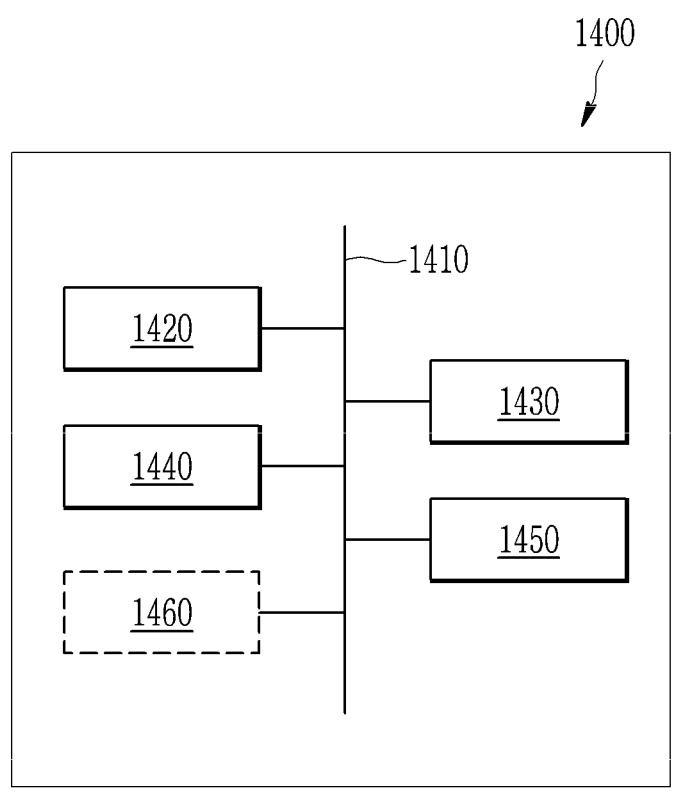
FIG. 14 is a diagram illustrating an electronic device according to some example embodiments.

FIG. 14 is a diagram illustrating an electronic device 1400 according to some example embodiments.

Referring to FIG. 14, the electronic device 1400 includes a memory 1420, a processor 1430, a device 1440, and a communication interface 1450. The device 1440 may include any of the optoelectronic diodes illustrated and described herein. The device 1440 may include any of the organic CMOS image sensors illustrated and described herein.

The electronic device 1400 may be included in one or more various electronic devices, including, for example, a mobile phone, a digital camera, a sensor device, a biosensor device, and the like. In some example embodiments, the electronic device 1400 may include one or more of an image providing server, a mobile device, a computing device, an image outputting device, and an image capturing device. A mobile device may include a mobile phone, a smartphone, a personal digital assistant (PDA), some combination thereof, or the like. A computing device may include a personal computer (PC), a tablet computer, a laptop computer, a netbook, some combination thereof, or the like. An image outputting device may include a TV, a smart TV, some combination thereof, or the like. An image capturing device may include a camera, a camcorder, some combination thereof, or the like.

The memory 1420, the processor 1430, the device 1440, and the communication interface 1450 may communicate with one another through a bus 1410.

The communication interface 1450 may communicate data from an external device using various Internet protocols. For example, the communication interface 1450 may communicate sensor data generated by the device 1440 to an external device. The external device may include, for example, an image providing server, a display device, a mobile device such as, a mobile phone, a smartphone, a personal digital assistant (PDA), a tablet computer, and a laptop computer, a computing device such as a personal computer (PC), a tablet PC, and a netbook, an image outputting device such as a TV and a smart TV, and an image capturing device such as a camera and a camcorder.

The processor 1430 may execute a program and control the electronic device 1400. A program code to be executed by the processor 1430 may be stored in the memory 1420. An electronic system may be connected to an external device through an input/output device (not shown) and exchange data with the external device.

The memory 1420 may store information output from the device 1440, including information transmitted from the transmission transistor 92. The memory 1420 may be a volatile or a nonvolatile memory. The memory 1420 may be a non-transitory computer readable storage medium. The memory may store computer-readable instructions that, when executed, cause the execution of one or more methods, functions, processes, etc. as described herein. In some example embodiments, the processor 1430 may execute one or more of the computer-readable instructions stored at the memory 1420.

In some example embodiments, the electronic device 1400 may include a display panel 1460 that may output an image generated based at least in part upon information output from the device 1440.

In some example embodiments, element 1460 may be absent from the electronic device 1400. In some example embodiments, the communication interface 1450 may include a USB and/or HDMI interface. In some example embodiments, the communication interface 1450 may include a wireless communication interface.

Figure 15:
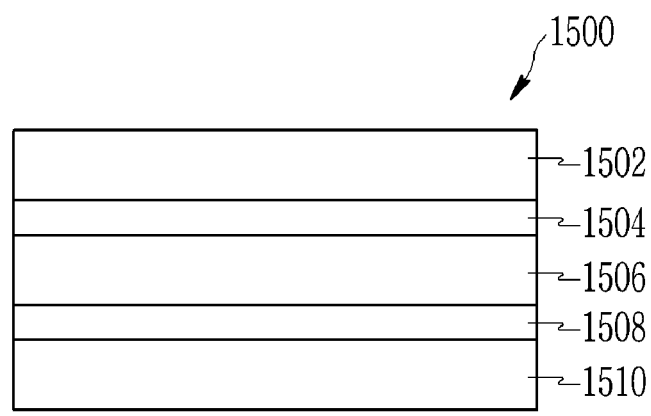
FIG. 15 is a cross-sectional view showing a solar cell according to some example embodiments.

FIG. 15 is a cross-sectional view showing a solar cell 1500 according to some example embodiments. Referring to FIG. 15, a solar cell 1500 includes a first electrode 1502 and a second electrode 1510, and a photoactive layer 1506 positioned between the first electrode 1502 and the second electrode 1510.

A substrate (not shown) may be positioned at the first electrode 1502 or the second electrode 1510, and may include a light-transmitting material. The light-transmitting material may include, for example, an inorganic material (e.g., glass), or an organic material (e.g., polycarbonate, polymethylmethacrylate, polyethylene terephthalate, polyethylene naphthalate, polyamide, polyethersulfone, or a combination thereof).

One of the first electrode 1502 and the second electrode 1510 is an anode and the other is a cathode. At least one of the first electrode 1502 and second electrode 1510 may be a light-transmitting electrode, and light may enter toward the light-transmitting electrode. The light-transmitting electrode may be made of, for example, a conductive oxide (e.g., indium tin oxide (ITO)), indium doped zinc oxide (IZO), tin oxide ($SnO_2$), aluminum-doped zinc oxide (AZO), and/or gallium-doped zinc oxide (GZO), or a transparent conductor of a conductive carbon composite (e.g., carbon nanotubes (CNT) or graphenes). At least one of the first electrode 1502 and the second electrode 1510 may be an opaque electrode, which may be made of an opaque conductor, for example, aluminum (Al), silver (Ag), gold (Au), and/or lithium (Li).

The photoactive layer 1506 may include an optoelectronic diode according to some example embodiments.

First and second auxiliary layers 1504 and 1508 may be positioned between the first electrode 1502 and the photoactive layer 1506 and between the second electrode 1510 and the photoactive layer 1506, respectively. The first and second auxiliary layers 1504 and 1508 may increase charge mobility between the first electrode 1502 and the photoactive layer 1506 and between the second electrode 1510 and the photoactive layer 1506. The first and second auxiliary layers 1504 and 1506 may be at least one selected from, for example, an electron injection layer (EIL), an electron transport layer, a hole injection layer (HIL), a hole transport layer, and a hole blocking layer, but are not limited thereto. One or both of the first and second auxiliary layers 1504 and 1508 may be omitted.

The photoactive layer 1506 may have a tandem structure where at least two thereof are stacked.

Figure 16:
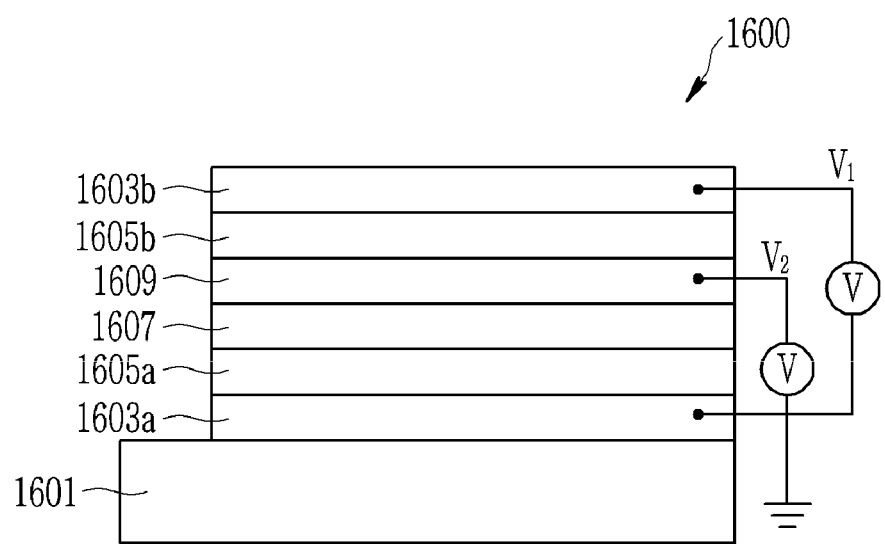
FIG. 16 is a sectional view of an organic light-emitting display apparatus according to some example embodiments.

FIG. 16 is a sectional view of an organic light-emitting display apparatus 1600 according to some example embodiments.

Referring to FIG. 16, a first electrode 1603a and a second electrode 1603b are positioned on a substrate 1601, a first emission layer 1605a is positioned on the first electrode 1603a, and a second emission layer 1605b is positioned under the second electrode 1603b.

The substrate 1601 may include a material selected from the group consisting of glass, quartz, silicon, a synthetic resin, a metal, and a combination thereof. The synthetic resin may include polyethylene naphthalate (PEN), polyethylene terephthalate (PET), polycarbonate, polyvinyl alcohol, polyacrylate, polyimide, polynorbornene and/or polyethersulfone (PES), etc. The metal plate may include a stainless steel foil and/or an aluminum foil, etc.

The first electrode 1603a may include a material having a work function of about 4.3 eV to about 5.0 eV, about 4.3 eV to about 4.7 eV, or about 4.3 eV to about 4.5 eV. According to example embodiments, the material may include aluminum (Al), copper (Cu), magnesium (Mg), molybdenum (Mo) and/or an alloy thereof, etc. In addition, these metals may be laminated to provide a first electrode. The first electrode 1603a may have a thickness of about 160 to about 160 nm.

The second electrode 1603b may include a material having a work function of about 16.3 eV to about 16.7 eV or about 16.5 eV to about 16.7 eV. According to some example embodiments, the second electrode 1603b may include Ba:Al. The second electrode 1603b may have a thickness of about 160 to about 160 nm.

The first emission layer 1605a and the second emission layer 1605b may include an optoelectronic diode according to some example embodiments.

A middle electrode 1609 is positioned between the first emission layer 1605a and the second emission layer 1605b. The middle electrode 1609 may include a material having a work function of about 5.0 eV to about 5.2 eV. According to some example embodiments, the material may include a conductive polymer. The conductive polymer may include polythiophene, polyaniline, polypyrrole, polyacene, polyphenylene, polyphenylenevinylene, a derivative thereof, a copolymer thereof, or a mixture thereof.

A buffer layer 1607 may be positioned between the first emission layer 1605a and the middle electrode 1609, and may include a material selected from the group consisting of a metal oxide, a polyelectrolyte, and combinations thereof. The combination thereof refers to the metal oxide and polyelectrolyte being mixed or laminated to provide a multilayer. In addition, the different kinds of metal oxide or polyelectrolyte may be laminated.

Figure 17:
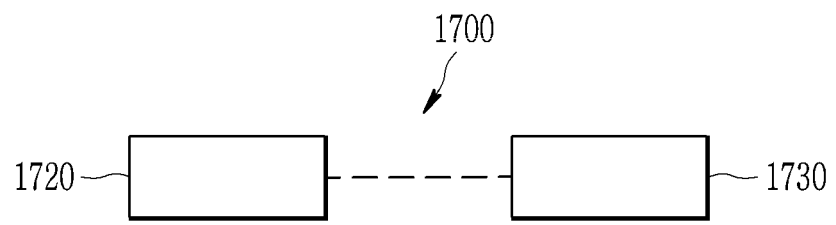
FIG. 17 is a view showing a sensor according to some example embodiments.

FIG. 17 is a view showing a sensor 1700 according to some example embodiments.

Referring to FIG. 17, a sensor 1700 (for example a gas sensor, light sensor, energy sensor, but example embodiments are not limited thereto) includes at least one electrode 1720 configured to output a signal to a processor 1730. The processor 1730 may include a microprocessor, but example embodiments are not limited thereto. The electrode 1720 may include an optoelectronic diode according to some example embodiments.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. An optoelectronic diode, comprising:
    a sequential stack of a first electrode, a first active layer, a second electrode, a second active layer, and a third electrode;
    a first diode including the first active layer, the first electrode, and the second electrode; and
    a second diode including the second active layer, the second electrode, and the third electrode;
    the second electrode having a refractive index different from a refractive index of the second active layer.

2. The optoelectronic diode of claim 1, further comprising:
    an anti-reflection layer on a surface of the first electrode, the anti-reflection layer having a refractive index between about 1.6 to about 2.5, the anti-reflection layer including at least one material of a metal oxide material, a metal sulfide material, and an organic material.

3. The optoelectronic diode of claim 1, wherein one electrode, of the first electrode, second electrode, and third electrode, includes a transparent electrode.

4. The optoelectronic diode of claim 1, wherein the first active layer includes a pn junction, the pn junction including a first p-type semiconductor and a first n-type semiconductor.

5. The optoelectronic diode of claim 4, wherein at least one semiconductor of the first p-type semiconductor and the first n-type semiconductor includes a light-absorbing material, the light-absorbing material configured to selectively absorb one of ultraviolet light, infrared light, visible light in a red wavelength spectrum of light, visible light in a green wavelength spectrum of light, and visible light in a blue wavelength spectrum of light.

6. The optoelectronic diode of claim 4, wherein a composition ratio ($p^1/n^1$) of the first p-type semiconductor relative to the first n-type semiconductor is greater than or equal to about 1.0.

7. The optoelectronic diode of claim 4, wherein the second active layer includes at least one semiconductor of a second p-type semiconductor and a second n-type semiconductor, the second p-type semiconductor being common with or different from the first p-type semiconductor, the second n-type semiconductor being common with or different from the first n-type semiconductor.

8. The optoelectronic diode of claim 4, wherein the first active layer is proximate to a light receiving side in relation to the second active layer.

9. The optoelectronic diode of claim 1, wherein the second electrode is electrically connected to the first electrode or the third electrode.

10. The optoelectronic diode of claim 9, wherein the second electrode is electrically connected to the first electrode, and an effective voltage of the second electrode is lower than an effective voltage of the first electrode.

11. The optoelectronic diode of claim 10, wherein the effective voltage of the first electrode is twice or more as high as the effective voltage of the second electrode.

12. The optoelectronic diode of claim 10, wherein sizes of effective voltages of the first electrode, the second electrode, and the third electrode is in an order of the first electrode, the second electrode, and the third electrode.

13. The optoelectronic diode of claim 10, wherein the first electrode and the second electrode are a common electrode, and the third electrode is a pixel electrode.

14. The optoelectronic diode of claim 9, wherein the second electrode is electrically connected to the third electrode, and an effective voltage of the second electrode is lower than an effective voltage of the third electrode.

15. The optoelectronic diode of claim 14, wherein the effective voltage of the third electrode is twice or more as high as the effective voltage of the second electrode.

16. The optoelectronic diode of claim 14, wherein sizes of effective voltages of the first electrode, the second electrode, and the third electrode is in an order of the third electrode, the second electrode, and the first electrode.

17. The optoelectronic diode of claim 14, wherein the second electrode and the third electrode are a common electrode, and the first electrode is a pixel electrode.

18. An optoelectronic diode, comprising:
    a first diode comprising a first electrode, a second electrode and a first active layer, the first active layer being between the first electrode and the second electrode, and
    a second diode comprising the second electrode, a third electrode and a second active layer, the second active layer being between the second electrode and the third electrode,
    wherein two electrodes of the first electrode, the second electrode and the third electrode are electrically connected to each other.

19. The optoelectronic diode of claim 18, wherein the first diode and the second diode are stacked each other.

20. The optoelectronic diode of claim 18, wherein the first active layer includes a first p-type semiconductor and a first n-type semiconductor,
    the second active layer includes at least one semiconductor of a second p-type semiconductor and a second n-type semiconductor, the second p-type semiconductor being common with or different from the first p-type semiconductor, the second n-type semiconductor being common with or different from the first n-type semiconductor, and
    at least one semiconductor of the first p-type semiconductor and the first n-type semiconductor includes a light-absorbing material, the light-absorbing material configured to selectively absorb one of ultraviolet light, infrared light, visible light in a red wavelength spectrum of light, visible light in a green wavelength spectrum of light, and visible light in a blue wavelength spectrum of light.

21. An image sensor comprising:
    the optoelectronic diode of claim 1.

22. An image sensor comprising:
    the optoelectronic diode of claim 18.

23. An electronic device comprising:
the optoelectronic diode of claim 1.
24. An electronic device comprising:
the optoelectronic diode of claim 18.

\* \* \* \* \*